United States Patent [19]
Nakazawa et al.

[11] Patent Number: 5,182,596
[45] Date of Patent: Jan. 26, 1993

[54] DEVICE FOR MEASURING SURFACE POTENTIALS AT PHOTOSENSITIVE BODY AND ELECTROSTATIC RECORDING APPARATUS USING SAID DEVICE

[75] Inventors: Takashi Nakazawa; Minoru Ohshima; Masami Ishikawa; Tsukasa Ogawa; Tohru Miyasaka; Takao Umeda, all of Ibaraki, Japan

[73] Assignees: Hitachi Koki Co., Ltd.; Hitachi Ltd., both of Tokyo, Japan

[21] Appl. No.: 727,740

[22] Filed: Jul. 10, 1991

[30] Foreign Application Priority Data

Jul. 20, 1990 [JP] Japan .................. 2-190531

[51] Int. Cl.$^5$ .................... G03G 15/00
[52] U.S. Cl. .................... 355/203; 324/457; 355/208
[58] Field of Search .............. 355/203, 204, 210, 219, 355/216, 239, 208; 118/664; 324/457, 458, 109; 364/550, 575

[56] References Cited

U.S. PATENT DOCUMENTS

| 3,674,353 | 7/1992 | Trachtenberg | 355/208 X |
|---|---|---|---|
| 4,019,102 | 4/1977 | Wallot | 361/225 |
| 4,063,154 | 12/1977 | Andrus et al. | 324/109 X |
| 4,284,344 | 8/1981 | Okamoto et al. | 355/208 X |
| 4,341,461 | 7/1982 | Fantozzi | 118/664 X |
| 5,040,021 | 8/1991 | Fowlkes | 355/246 X |
| 5,066,918 | 11/1991 | Pazda et al. | 355/216 X |

FOREIGN PATENT DOCUMENTS

| 55-29856 | 3/1980 | Japan . | |
|---|---|---|---|
| 0097356 | 8/1981 | Japan . | |
| 56-150361 | 11/1981 | Japan | 324/457 |
| 0169763 | 10/1982 | Japan . | |
| 0106764 | 5/1988 | Japan . | |
| 1-248165 | 10/1989 | Japan . | |
| 2-118677 | 5/1990 | Japan . | |

Primary Examiner—Joan H. Pendegrass
Assistant Examiner—T. A. Dang
Attorney, Agent, or Firm—Sughrue, Mion, Zinn, Macpeak & Seas

[57] ABSTRACT

A device for measuring a surface potential at a photosensitive body including: a potential sensor for measuring surface potentials at a plurality of positions on the photosensitive body; a plurality of sample hold circuits; and an adder for adding each measured surface potential held in each sample hold circuit, or an adder which adds up each measured surface potential and average the sum. The addition or averaging of the measured values serves to eliminate eccentricity-induced errors and noise in the surface potential measurements, thereby allowing a correct surface potential to be obtained.

7 Claims, 2 Drawing Sheets

DEVICE FOR MEASURING SURFACE POTENTIALS AT PHOTOSENSITIVE BODY AND ELECTROSTATIC RECORDING APPARATUS USING SAID DEVICE

BACKGROUND OF THE INVENTION

1. Field of the Invention

The invention relates to a device for measuring surface potentials at a photosensitive body in an electrostatic recording apparatus. More particularly, it is directed to a device for measuring surface potentials at a photosensitive body which corrects surface potential measurement errors caused by eccentricity, noise, and the like to an electrostatic recording apparatus using such surface potential measurement device.

2. Prior Art

As shown in FIG. 4, a conventional circuit for measuring surface potentials at a photosensitive body detects a surface potential at a photosensitive body 1 using a potential sensor 2, measures the surface potential by converting the detected voltage level with a measurement circuit 7, and holds the measured surface potential at a predetermined timing by a sample-hold circuit 5. The control of corona currents at a charging unit 14 is performed by a control circuit 8 based on the measured surface potential. Reference numeral 15 designates a corona power source (see Japanese Patent Unexamined Publication No. 29856/1980).

In the above conventional art, if the potential sensor 2 is of such a type that relative values are outputted, eccentricity of the photosensitive body 1 causes the distance between the photosensitive body 1 and the potential sensor 2 to fluctuate, thereby varying potential sensor outputs. As a result, errors are introduced into measured surface potentials, which further leads to improper controls in subsequent processes, ending up with inconsistent printing quality. Further, independently of the type of potential sensor, these problems are similarly encountered if the potential sensor outputs are contaminated by noise.

SUMMARY OF THE INVENTION

An object of the invention is therefore to provide a device for measuring surface potentials at a photosensitive body whose measurement accuracy is improved by removing influence of fluctuations upon the surface potential measurement device, and to provide an electrostatic recording apparatus which controls the processing steps of charging, exposing, and developing print objects while using such surface potential measurement device.

To achieve the above object, the invention is applied to a device for measuring surface potentials at a photosensitive body, which measures at least two surface potential every rotation of the photosensitive body, and adds up the measured values or average them. To implement this operation, the device includes: at least a single surface potential measurement means which can measure the surface potential at a plurality of positions on the photosensitive body; at least a single hold means which can hold the measured surface potentials; and addition means which can add a plurality of measured surface potentials up, or further includes means which can average the outputs of the addition means. And a correct surface potential from which eccentricity-and noise-induced errors are eliminated can be obtained by adding or averaging the surface potentials measured at the plurality of positions on the photosensitive body while driving the hold means by a timing circuit. Further, the invention is applied to an electrostatic recording apparatus which can perform electrostatic recording with consistent printing quality by controlling its processes of charging, exposing, and developing print objects while using the above surface potential measurement device.

Thus the constructed device for measuring surface potentials at a photosensitive body of the invention measures the surface potential at a plurality of positions on the photosensitive body and extracts a correct surface potential by eliminating eccentricity-induced fluctuations and noise in the surface potential measurements while adding or averaging the respective measured values.

Further, the correct surface potential obtained by the above device further allows the electrostatic recording apparatus to control its recording conditions such as charging conditions, exposing conditions, and developing bias conditions.

DETAILED DESCRIPTION OF THE PREFERRED EMBODIMENTS

Embodiments of the invention will now be described with reference to the accompanying drawings.

Figure 1:
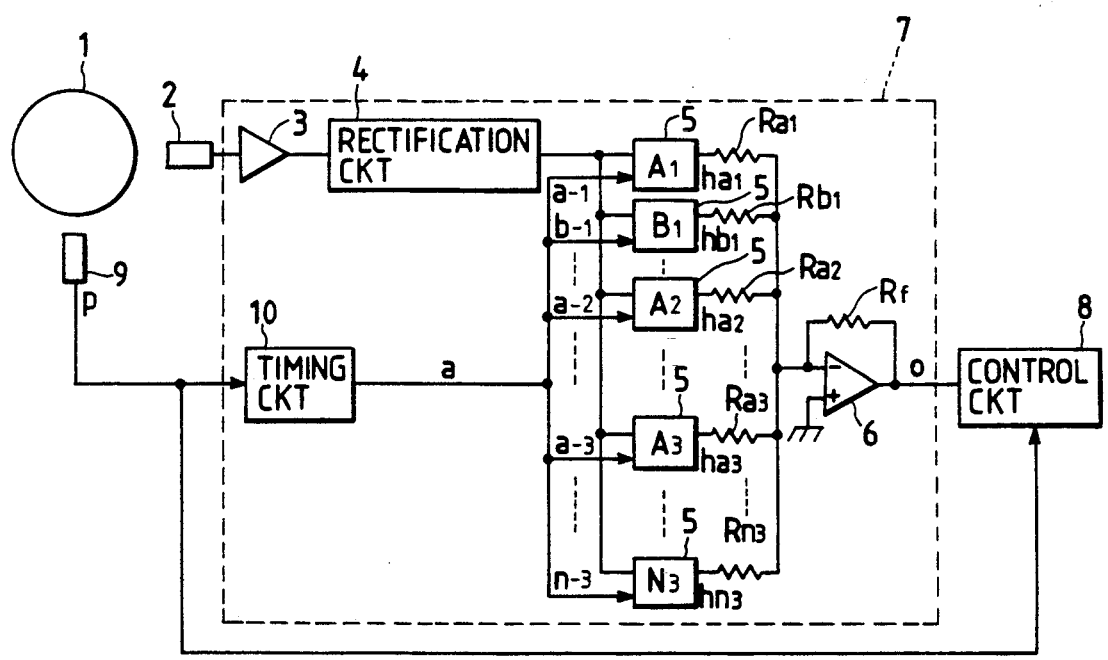
FIG. 1 is a diagram showing a circuit, which is an embodiment of the invention.

FIG. 1 is a diagram showing an embodiment of the invention. A potential sensor 2, a sample hold circuit 5, an adder 6, and the like constitute a main portion of the invention.

In FIG. 1, the potential sensor 2 is a vibrating reed type sensor and outputs an ac signal which is proportional to the magnitude of a surface potential at a photosensitive drum 1. This ac signal goes through an amplifier 3 and is rectified at a rectification circuit 4 to be converted into a measured surface potential. Here, surface potential measurement errors caused by eccentricity of the photosensitive drum 1 can be removed by measuring the surface potential at least at two points, which points equally divide the distance the photosensitive drum 1 travels as it makes one full rotation and by averaging such measured values. To implement such an operation, sample hold circuits A1, A2, A3, and so on are provided in FIG. 1, these circuits serving to extract a surface potential every 120 degrees as the photosensitive drum 1 makes one rotation and hold the extracted surface potentials. The outputs of the circuits A1, A2, A3, and so on are added at the adder 6 and then applied to a control circuit 8.

While the above example is a case where three measurements are made per rotation by extraction of every 120 degrees, an extraction of, e.g., every 90 degrees may produce four measurements per rotation, which improves the averaging accuracy.

A timing circuit 10 serves to generate a timing signal which activates each sample hold circuit every 120 degrees based on a signal that indicates the position of the photosensitive drum 1 detected by a position sensor 9.

The output of the potential sensor 2 incorporates superposition of various types of noise on the eccentricity-induced fluctuations. As known by the Nyquist theorem, such noise can be removed if the sampling frequency is increased to a value twice or more the frequency band to which the noise belongs.

Sample hold circuits B1 to N3 and so on shown in FIG. 1 are additionally provided to increase the sampling frequency and thereby reduce the noise in accordance with the above rule. The number of circuits is determined in function of the degree to which the noise should be reduced. If the noise is unobjectionably small, the sample hold circuits B1 to N3 and so on may be omitted.

Figure 2:
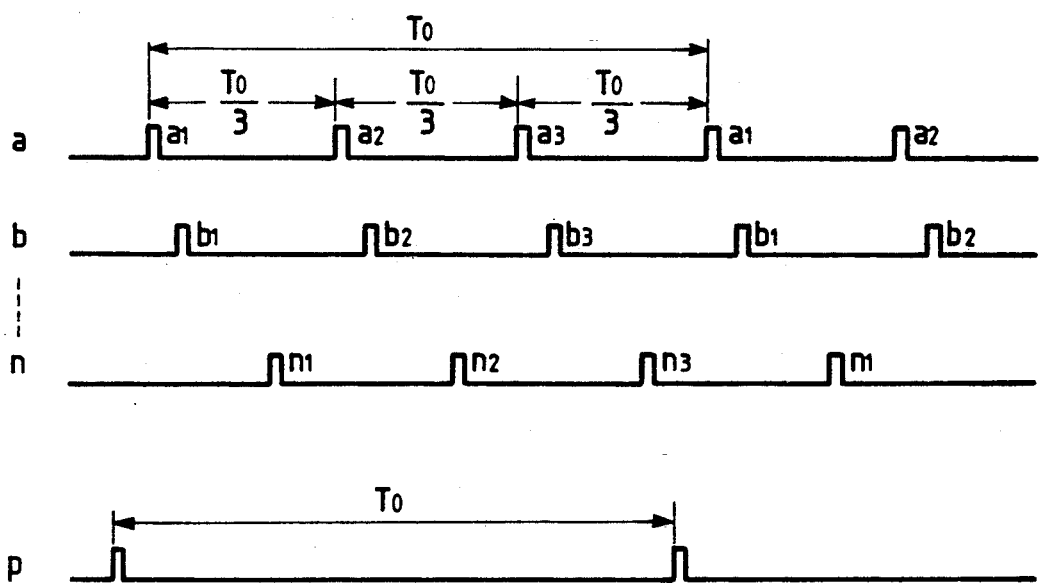
FIG. 2 is a diagram showing waveforms at the time the embodiment of the invention is operated.

FIG. 2 is a waveform diagram illustrating the operation of the circuits shown in FIG. 1 in more detail. In FIG. 2, reference character p designates a position signal detected by the position sensor once every rotation of the photosensitive drum 1. The timing circuit 10 generates pulse signals a, b, ..., n, and so on based on the position signal p, thereby activating the sample hold circuits A1 to A3, B1 to B3, N1 to N3, and so on.

Each of the pulse signals a, b, n, and so on includes three pulses such as a1, a2, a3, b1, b2, b3, ..., n1, n2, n3, and so on every time $To/3$ within a cycle $To$ of the signal p. For example, the sample hold circuit A1 is activated by the pulse a1 as shown in FIG. 1. The pulses a1, b1, ..., n1, and so on are generated at such a cycle as not to overlap any two adjacent pulses. The same applies to the pulses a2, b2, ..., n2, and so on and a3, b3, ..., n3, and so on.

The sample hold circuit A1 samples an output of the rectification circuit 4 by the pulse a1 and holds the sampled pulse until it receives a pulse a1 at a next cycle. The same applies to the sample hold circuits A2, A3, B1 to B3, and N1 to N3, and so on.

As described above, the adder 6 shown in FIG. 1 produces a sum of the measured surface potentials from which errors caused by eccentricity of the photosensitive drum 1 and noise are removed.

In FIG. 1, if circuit constants Ra1, ..., Rn3, Rfae properly selected, the adder 6 can produce an average of the measured surface potentials.

Figure 3:
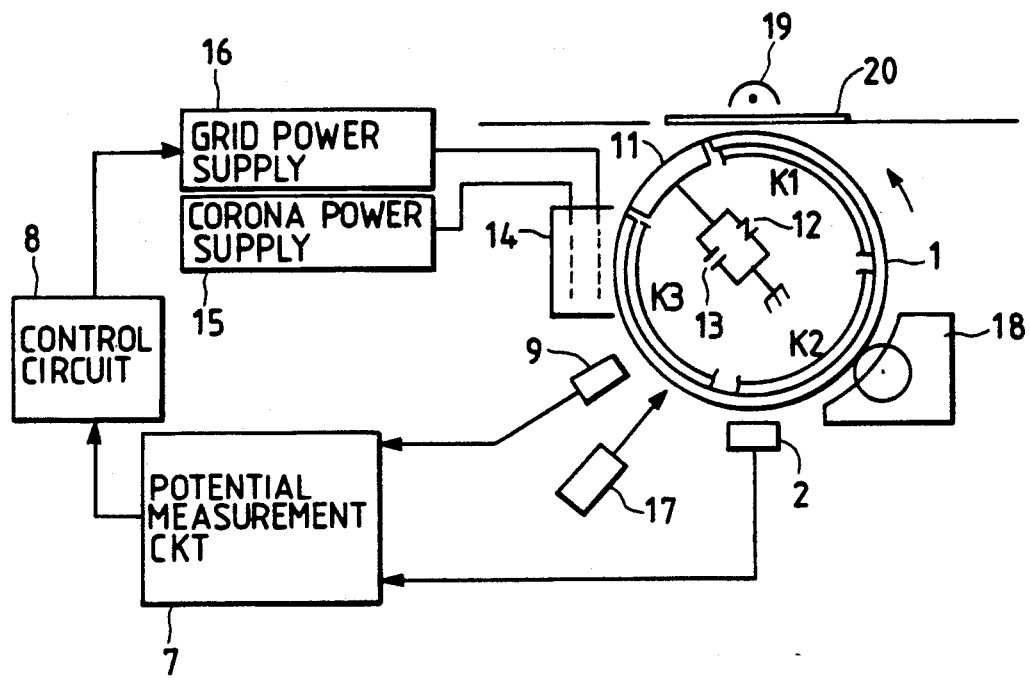
FIG. 3 is a diagram showing the construction of an electrostatic recording apparatus, which is an embodiment of the invention.
Figure 4:
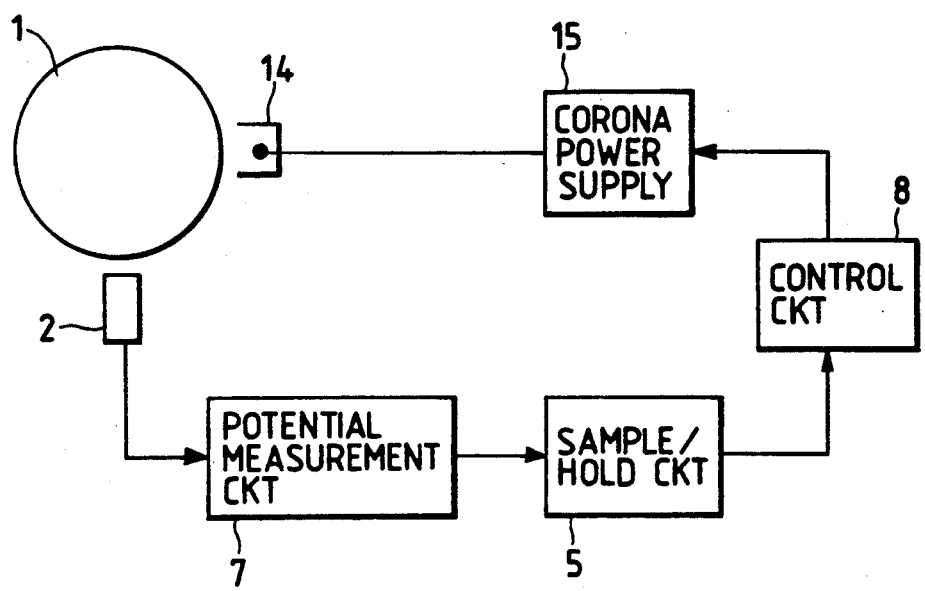
FIG. 4 is a diagram showing a conventional example.

FIG. 3 shows an embodiment of an electrostatic recording apparatus using the surface potential measurement device described above. The electrostatic recording apparatus shown in FIG. 3, which records three cut sheets 20 per rotation of a photosensitive drum 1, performs a series of electrostatic recording processes using the photosensitive drum 1, and a charging unit 14, an exposing unit 17, a developing unit 18, and a transfer unit 19, these units surrounding the photosensitive drum 1. The position sensor 9 and the potential sensor 2, both confronting the photosensitive drum 1, are connected to the surface potential measurement device, and a grid power supply 16 of the charging unit 14 is controlled based on the output of the surface potential measurement device. Reference numeral 7 designates a potential measurement circuit; 8, a control circuit; and 15, a corona power source.

A reference potential unit 11 is provided on a part of the photosensitive drum 1. This unit 11 is disclosed in Japanese Patent Application No. 65636/1988. Specifically, the reference potential unit 11, which is grounded by a circuit having a varistor 12 and a capacitor 13 connected in parallel, gets its capacitor 13 to be charged by the charging unit 14 during rotation of the photosensitive drum 1 and passing of the reference potential unit 11 by the charging unit 14. However, a voltage limiting characteristic of the varistor 12 maintains the voltage of the capacitor 13 constant, thereby making the potential of the reference potential unit 11 unaffected by the voltage of the charging unit 14.

The reference potential is thus produced, and it is preset to an optimal value in accordance with such factors as the characteristics of the photosensitive drum 1, the wavelength of a light source, and the like.

Since this electrostatic recording apparatus makes three recordings per rotation of the photosensitive drum as described above, three regions K1, K2, K3, which are used in correspondence with the recording sheets, are defined on the photosensitive drum 1. Upon detection of the position of the reference potential unit 11 by the position sensor 9, the reference potential unit 11 and the surface potentials at the respective three regions K1, K2, K3 on the photosensitive drum, are detected by the surface potential measurement device, the regions being used very frequently and directly affecting the recording quality. And by comparing the voltage at the reference potential unit 11 with the potentials at the photosensitive drum 1, the grid power supply 16 of the charging unit 14 is varied so that the surface potential at the photosensitive drum 1 is set to a desired potential, e.g., a potential equal to the reference potential.

This can set and maintain proper charging conditions which allow a high-definition recording to be made.

It may be the potential level of a corona power supply 15 for the charging unit that is varied, or instead, it may be conditions involved in the electrostatic recording processes other than the charging conditions that are varied. For example, the potential at a not shown developing bias voltage supply may be varied.

According to the invention, eccentricity- or noise-induced errors in the measurement of the surface potentials at the photosensitive body can be removed, thereby allowing surface potentials to be measured accurately.

Further, the surface potentials thus measured serve to change the charging, developing, and other conditions in the electrostatic recording processes properly, thereby contributing to providing electrostatic recording with high printing quality.

What is claimed is:

1. A device for measuring a surface potential on a photosensitive body, said device detecting a position on said photosensitive body using a position sensor and measuring said surface potential on said photosensitive body based on an output of said position sensor, said device comprising:
   means for measuring said surface potential at a plurality of positions on said photosensitive body where said measuring means comprises a single surface potential measurement device;
   a plurality of holding means for holding measured surface potentials; and
   means for adding each of said measured surface potentials held in each of said holding means.

2. A device according to claim 1, wherein said measuring means detects a relative quantity of said surface potential.

3. A device according to claim 1, wherein said measuring means detects an absolute quantity of said surface potential.

4. A device according to claim 1, 2, or 3, further comprising means for outputting an average by dividing an output from said adding means by a number of measurements made, where an electrostatic apparatus controls at least one of a number of conditions based on a signal representing said average, said conditions including a charged voltage, an exposing condition, and developing bias.

5. A device according to claim 2, wherein said holding means receives an output from said surface potential measurement means, and an output from said holding means is received by said adding means.

6. A device according to claim 1, wherein said measuring means comprises said surface potential measurement device which measures said surface potential at said plurality of positions on said photosensitive body and at a plurality of timings, and said holding means comprises a timing circuit and at least two sample-hold circuits.

7. A device according to claim 1, wherein said adding means is provided to produce a signal that controls one of a number of conditions in an electrostatic recording apparatus, said conditions including a charged voltage, an exposing condition, and a developing bias.

* * * * *